(12) United States Patent
Moon et al.

(10) Patent No.: US 12,520,643 B2
(45) Date of Patent: Jan. 6, 2026

(54) HEAT DISSIPATION LAYER AND FLEXIBLE DISPLAY DEVICE INCLUDING THE SAME

(71) Applicant: Samsung Display Co., LTD., Yongin-si (KR)

(72) Inventors: Soo Hyun Moon, Yongin-si (KR); Won Tae Kim, Yongin-si (KR); Jun Seok Min, Yongin-si (KR); Woo Guen Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 436 days.

(21) Appl. No.: 18/093,406

(22) Filed: Jan. 5, 2023

(65) Prior Publication Data
US 2023/0223504 A1 Jul. 13, 2023

(30) Foreign Application Priority Data
Jan. 10, 2022 (KR) .................. 10-2022-0003595

(51) Int. Cl.
*H10H 20/858* (2025.01)
*H01L 25/16* (2023.01)
*H05K 7/20* (2006.01)

(52) U.S. Cl.
CPC ....... *H10H 20/8582* (2025.01); *H01L 25/167* (2013.01); *H05K 7/20963* (2013.01); *H10H 20/8581* (2025.01)

(58) Field of Classification Search
CPC ........... H10H 20/8582; H10H 20/8581; H10H 20/8583; H10H 29/142; H10H 20/8506; H01L 25/167; H05K 7/20963; G09G 2300/0426; G09G 2330/04; G09G 2330/045; G09G 2380/02; G09G 3/035; G09G 3/3225; G09G 3/32; H10K 2102/311; H10K 50/00; H10K 50/841; H10K 59/10; H10K 50/80; H10K 50/87; H10K 59/00; H10K 59/12; H10K 71/00; H10K 77/111; Y02E 10/549; G09F 9/301; G09F 9/33; G09F 9/335

See application file for complete search history.

(56) References Cited

U.S. PATENT DOCUMENTS

| 9,685,636 B2 * | 6/2017 | Park ..................... H10K 50/84 |
| 10,538,054 B2 | 1/2020 | Kagawa | |
| 2008/0191220 A1 * | 8/2008 | Daniels ................ H01L 24/83 |
| | | | 257/E33.001 |
| 2015/0016122 A1 * | 1/2015 | Roberts .................. F21S 4/24 |
| | | | 362/373 |

(Continued)

FOREIGN PATENT DOCUMENTS

| CN | 112234152 | 1/2021 |
| KR | 10-2019-0081281 | 7/2019 |
| KR | 10-2242805 | 4/2021 |

*Primary Examiner* — J. E. Schoenholtz
(74) *Attorney, Agent, or Firm* — Womble Bond Dickinson (US) LLP

(57) ABSTRACT

According to an embodiment of the disclosure, a flexible display device includes a display part including a light emitting element disposed on a base layer, and a panel cover disposed on a rear surface of the display part and including a heat dissipation layer. The heat dissipation layer includes a base heat dissipation layer, and a heat dissipation pattern patterned on the base heat dissipation layer.

15 Claims, 8 Drawing Sheets

(56) References Cited

U.S. PATENT DOCUMENTS

| | | | |
|---|---|---|---|
| 2016/0027718 A1* | 1/2016 | Park | H10K 50/87 |
| | | | 165/80.3 |
| 2016/0055793 A1* | 2/2016 | Jang | B32B 5/18 |
| | | | 428/408 |
| 2020/0344899 A1 | 10/2020 | Myung et al. | |
| 2020/0393936 A1* | 12/2020 | Bok | G06F 3/0446 |
| 2024/0423017 A1* | 12/2024 | Cha | H10K 50/84 |

* cited by examiner

HEAT DISSIPATION LAYER AND FLEXIBLE DISPLAY DEVICE INCLUDING THE SAME

CROSS-REFERENCE TO RELATED APPLICATION(S)

The application claims priority to and the benefit of Korean Patent Application No. 10-2022-0003595 under 35 U.S.C. § 119, filed Jan. 10, 2022 in the Korean Intellectual Property Office (KIPO), the entire contents of which are incorporated herein by reference.

BACKGROUND

1. Technical Field

The disclosure relates to a heat dissipation layer and a flexible display device including the same.

2. Description of Related Art

In recent years, as interest in information display increases, research and development on display devices is continuously conducted.

SUMMARY

An aspect of the disclosure is to provide a heat dissipation layer capable of improving heat dissipation efficiency and preventing damage to a heat dissipation structure, and a flexible display device including the same.

Aspects of the disclosure are not limited to the above-described aspect, and other aspects not mentioned will be clearly understood by those skilled in the art from the following description.

According to an embodiment of the disclosure, a flexible display device may include a display part including a light emitting element disposed on a base layer, and a panel cover disposed on a rear surface of the display part and including a heat dissipation layer. The heat dissipation layer may include a base heat dissipation layer, and a heat dissipation pattern patterned on the base heat dissipation layer.

The flexible display device may further include a display panel including the display part and the panel cover, the display panel being rollable in a rolling direction. The heat dissipation layer may be rolled in case that the display panel is rolled.

The heat dissipation layer may include graphite.

The base heat dissipation layer may be disposed between the base layer of the display part and the heat dissipation pattern of the heat dissipation layer.

The base heat dissipation layer may include a first surface, and a second surface. The first surface may be adjacent to the base layer, and the second surface of the base heat dissipation layer may be in physical contact with the heat dissipation pattern.

The base heat dissipation layer and the heat dissipation pattern may be integral with each other.

The base heat dissipation layer and the heat dissipation pattern may be provided by performing a molding process on a graphite member.

The heat dissipation pattern may have a shape protruding in a thickness direction of the base heat dissipation layer.

At least a portion of the base heat dissipation layer on which the heat dissipation pattern may not be disposed and at least a portion of the heat dissipation pattern may be exposed.

The heat dissipation layer may include a groove area disposed between adjacent heat dissipation patterns, and a side surface of the heat dissipation pattern may be exposed in the groove area.

The heat dissipation pattern may be a pattern extending in a pattern direction that may be different from the rolling direction, and may have a triangular column shape.

At least a portion of adjacent heat dissipation patterns may be in physical contact with each other in case that the heat dissipation layer is rolled.

The heat dissipation pattern may be a pattern extending in a pattern direction that may be different from the rolling direction, and may have a rectangular column shape.

An inner cavity may be formed in which adjacent heat dissipation patterns may not contact each other in case that the heat dissipation layer is rolled.

The heat dissipation pattern may be a pattern extending in a pattern direction that may be different from the rolling direction, and may have a cylindrical shape.

The heat dissipation pattern may include pattern portions arranged in a lattice structure defined by a first pattern direction and a second pattern direction. The first pattern direction and the rolling direction may be same, and the second pattern direction and the rolling direction may be different.

The pattern portions may have a rectangular column shape protruding in a display direction of the display panel.

The display panel may be at least one of a flexible organic light emitting display panel (OLED panel), a flexible light emitting diode display panel (flexible micro-LED or nano LED display panel), and a flexible quantum dot organic light emitting display panel (QD OLED panel).

A length of a side of the heat dissipation pattern may be less than or equal to a radius of a circle defined by the heat dissipation layer in case that the display panel is rolled.

According to another embodiment of the disclosure, a heat dissipation layer may include a base heat dissipation layer, and heat dissipation patterns patterned on the base heat dissipation layer. The heat dissipation patterns may protrude in a thickness direction of the heat dissipation layer.

Aspects of the disclosure are not limited to the above-described aspects, and aspects that are not mentioned may be clearly understood by those skilled in the art from the specification and the accompanying drawings.

BRIEF DESCRIPTION OF THE DRAWINGS

The accompanying drawings, which are included to provide a further understanding of the disclosure, and are incorporated in and constitute a part of this specification, illustrate some embodiments, and, together with the description, serve to explain principles of the disclosure.

DETAILED DESCRIPTION OF THE EMBODIMENTS

Figure 1:
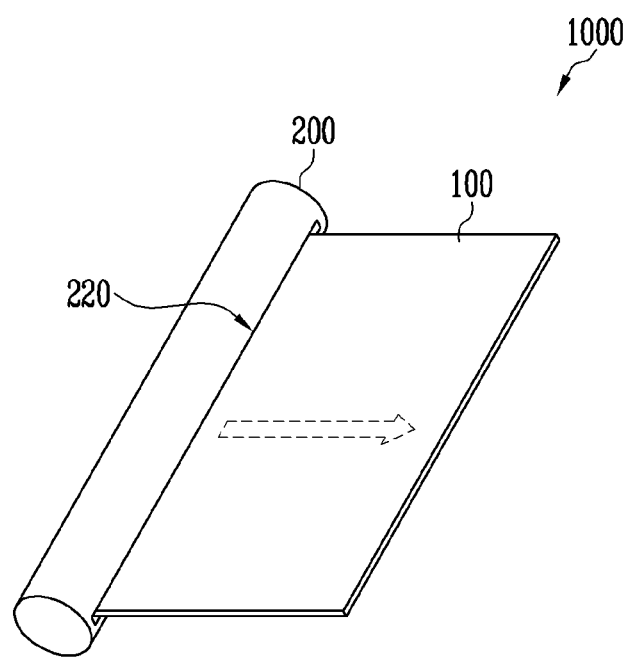
FIG. 1 is a perspective view schematically illustrating a display device according to an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, and/or combinations thereof but do not preclude the presence or addition of one or more other features, integers, steps, operations, elements, components, and/or combinations thereof. In case that a first part such as a layer, film, region, element, etc. is on a second part, the first part may be not only "directly on" the second part but a third part may intervene between them. Furthermore, in the disclosure, when a first part such as a layer, film, region, element, etc. is formed on a second part, a direction in which the first part is formed is not limited to an upper direction of the second part, but may include a side or a lower direction of the second part. To the contrary, when a first part such as a layer, film, region, element, etc. is "under" a second part, the first part may be not only "directly under" the second part but a third part may intervene between them.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure relates to a heat dissipation layer and a flexible display device including the same. Hereinafter, a heat dissipation layer and a flexible display device including the same according to embodiments will be described with reference to the accompanying drawings.

FIG. 1 is a perspective view schematically illustrating a display device according to an embodiment.

A display device 1000 may be configured to emit light. The display device 1000 may be a flexible display device. For example, the display device 1000 may be at least one of a rollable display device, a bendable display device, and a foldable display device.

Hereinafter, for convenience of description, a case in which the display device 1000 may be a rollable display device will be described as an example.

Referring to FIG. 1, the display device 1000 may include a display panel 100 and a housing 200 accommodating the display panel 100. The display panel 100 may be wound with a curvature within the housing 200.

The display panel 100 may be implemented as a flexible display panel configured to self-emit light such as a flexible organic light emitting display panel (OLED panel), a flexible light emitting diode display panel (flexible micro-LED or nano LED display panel), and a flexible quantum dot organic light emitting display panel (QD OLED panel).

Hereinafter, for convenience of description, an embodiment in which the display panel 100 may be a flexible light emitting diode display panel will be described as an example.

Figure 5:
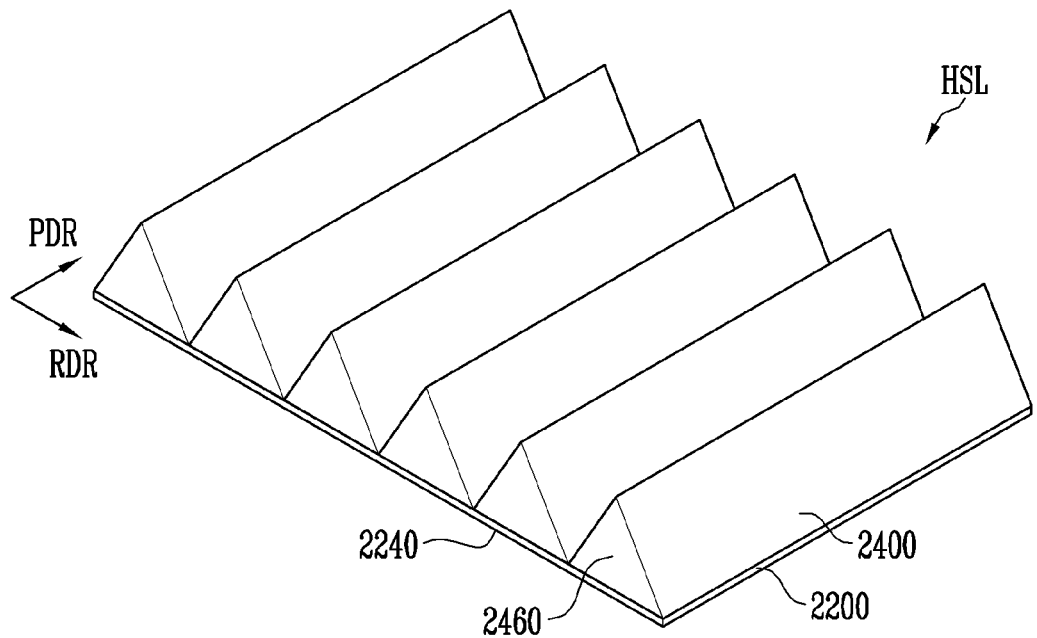
FIGS. 5 and 6 are diagrams schematically illustrating a heat dissipation layer according to an embodiment.

The display panel 100 may be rolled along (in) a rolling direction RDR (refer to FIG. 5). In case that a power source is applied to the display device 1000 or a display function operates, the display panel 100 wound on a roller inside the housing 200 may be exposed to outside of the housing 200 while sliding in a direction indicated by the dotted line by rotation of the roller. Also, in case that the power source is not applied to the display device 1000 or the display function does not operate, the display panel 100 may be wound around the roller inside the housing 200 while sliding in a direction opposite to the direction indicated by the dotted line by rotation of the roller.

The display panel 100 may slide while moving in left and right directions along a housing groove 220. The housing groove 220 may be implemented to fit the horizontal (or width) length of the display panel 100.

Although the housing 200 is shown as a cylindrical shape in FIG. 1, the shape of the housing 200 is not limited thereto and may be variously modified.

Figure 2:
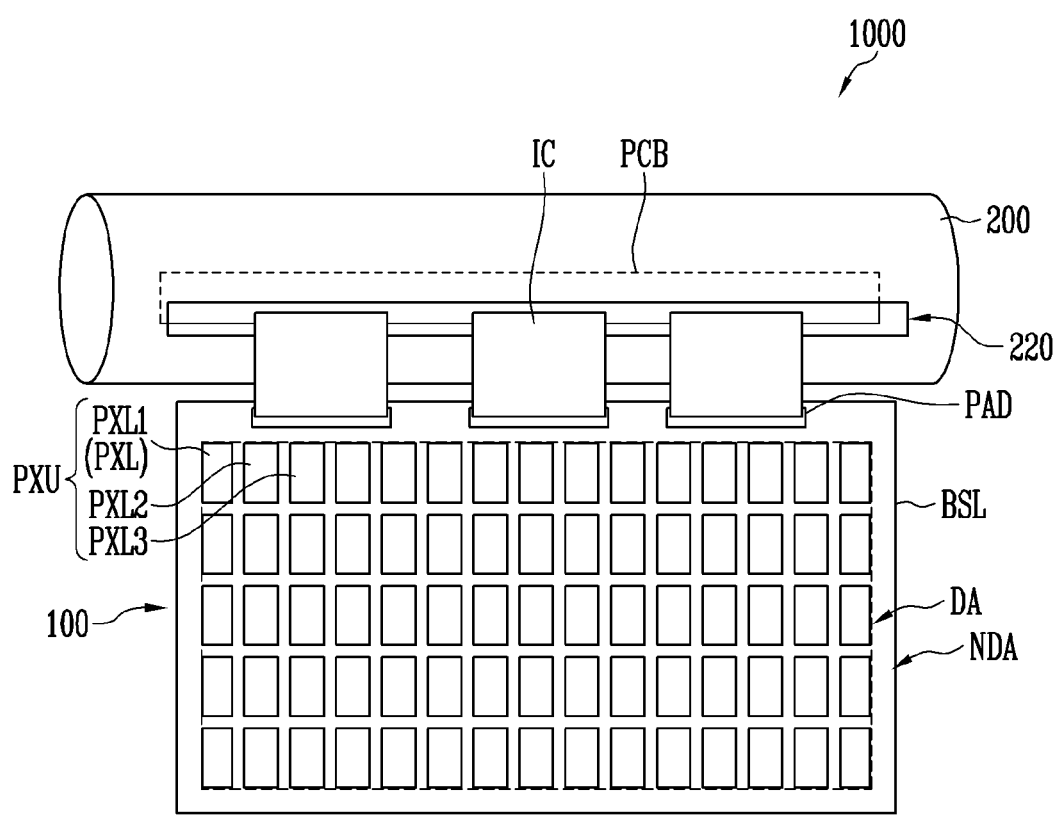
FIG. 2 is a diagram schematically illustrating a display panel and a housing according to an embodiment.

FIG. 2 is a diagram schematically illustrating a display panel and a housing according to an embodiment. FIG. 2 schematically shows a state in which the display panel 100 and the housing 200 may be connected to each other.

Referring to FIG. 2, the display panel 100 may be connected to the housing 200. For example, the display panel 100 may be introduced into the housing 200 as a printed circuit board PCB may be inserted through the housing groove 220.

The display panel 100 may include a base layer BSL, pixels PXL disposed on the base layer BSL, and a pad unit PAD disposed on the base layer BSL.

The base layer BSL may constitute a base member of the display panel 100. According to an embodiment, the base layer BSL may be a rigid or flexible substrate or film, and the material or properties thereof are not particularly limited. For example, the base layer BSL may be a rigid substrate made of glass or tempered glass, a flexible substrate (or thin film) made of plastic or metal, or at least one insulating film, and the material and/or properties thereof are not particularly limited.

The base layer BSL may include a display area DA displaying an image and a non-display area NDA excluding the display area DA. The non-display area NDA may be an area in which an image may not be displayed, and may be a bezel area surrounding the display area DA.

Pixels PXL may be dispersed and arranged in the display area DA. For example, the pixels PXL may be arranged in the display area DA in an arrangement structure such as a matrix or a stripe. However, the disclosure is not limited thereto.

At least one pixel PXL may form a pixel unit PXU. For example, one pixel unit PXU may include a first pixel PXL1, a second pixel PXL2, and a third pixel PXL3, and the first to third pixels PXL1, PXL2, and PXL3 may emit light of different colors.

The non-display area NDA may be positioned around the display area DA to surround the display area DA. In the non-display area NDA, wirings connected to the pixels PXL of the display area DA, pad units PAD, a driving circuit, and the like may be disposed.

In the display area DA, the pixels PXL may be electrically connected to the driving circuit for driving the pixels PXL through the pad units PAD and/or signal wirings.

The driving circuit may include a gate driving circuit for applying a scan signal to the pixels PXL through a gate line and a data driving circuit for applying a data voltage to the pixels PXL through a data line. The gate driving circuit and the data driving circuit may be implemented as thin film transistors (TFT) in the non-display area NDA. A driving integrated circuit IC including the gate driving circuit or the data driving circuit may be mounted on a separate printed circuit board, and may be connected to an interface disposed in the non-display area NDA through a circuit film such as a flexible printed circuit board (FPCB), a chip on film (COF), and a tape carrier package (TCP).

The pad unit PAD may be attached to the driving integrated circuit IC and physically and/or electrically connected to the driving integrated circuit IC. The driving integrated circuit IC may be attached to the printed circuit board PCB and physically and/or electrically connected to the printed circuit board PCB. Accordingly, a signal, a voltage, and the like applied from the printed circuit board PCB may be applied to the pixels PXL through the pad unit PAD as a scan signal, a data voltage, a driving voltage, and the like.

According to an embodiment, in the display device 1000, the display panel 100 may be wound along an inner surface of the housing 200 while the housing 200 rotates in the rolling direction RDR. According to an embodiment, an area of the display panel 100 may be in contact with and fixed to the housing 200.

Figure 3:
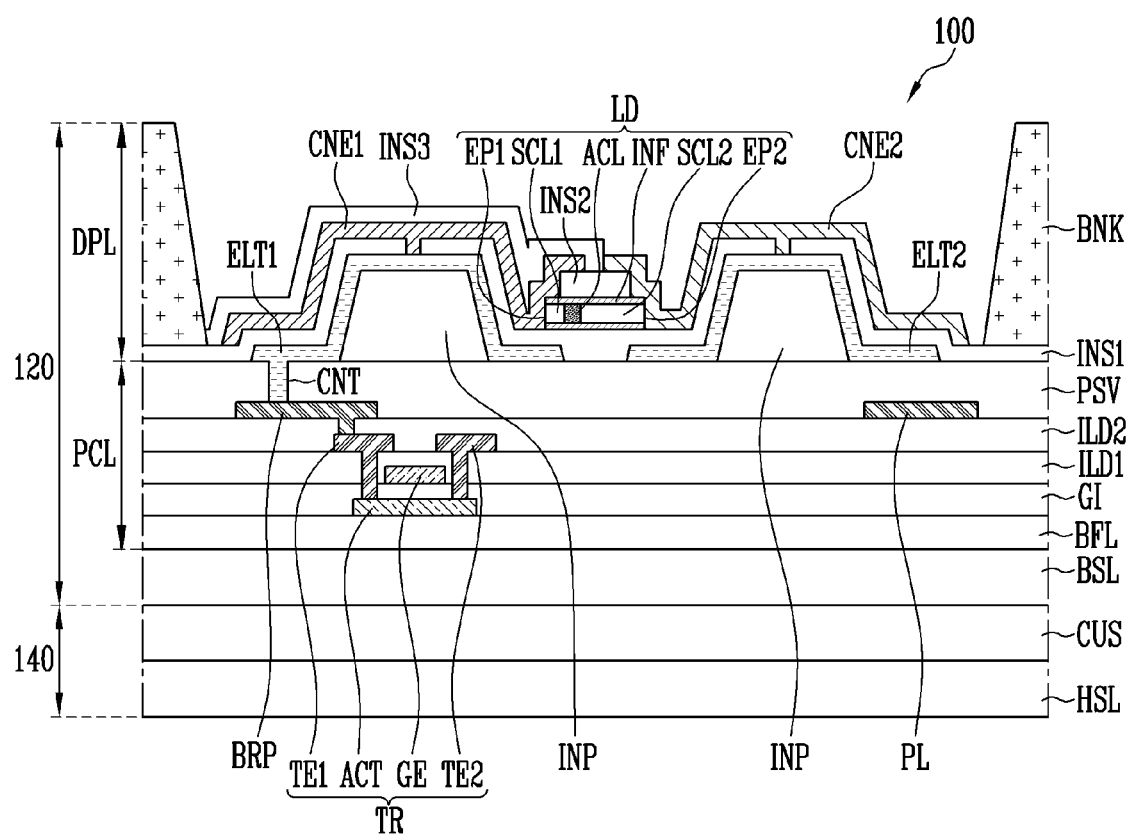
FIG. 3 is a cross-sectional view schematically illustrating the display panel according to an embodiment.

Hereinafter, a cross-sectional structure of the display panel 100 according to an embodiment will be described in detail with reference to FIG. 3. Contents that may be duplicative of that described above will be briefly described or omitted. FIG. 3 is a cross-sectional view schematically illustrating the display panel according to an embodiment.

According to an embodiment, the display panel 100 may be a flexible light emitting diode display panel. The display panel 100 may include a display unit (display part) 120 and a panel cover unit (cover) 140 disposed on a rear surface of the display unit 120.

The display unit 120 may include the base layer BSL, a pixel circuit unit PCL, and a display element unit DPL.

The base layer BSL may provide an area in which the pixel circuit unit PCL and the display element unit DPL may be disposed. The base layer BSL may form (or constitute) a base member of the pixel PXL.

The pixel circuit unit PCL may be disposed on the base layer BSL. The pixel circuit unit PCL may include a buffer layer BFL, a transistor TR, a gate insulating layer GI, a first interlayer insulating layer ILD1, a second interlayer insulating layer ILD2, a bridge pattern BRP, a power source line PL, a passivation layer PSV, and a contact portion CNT.

The buffer layer BFL may be disposed on the base layer BSL. The buffer layer BFL may prevent impurities from diffusing from outside. The buffer layer BFL may include at least one of silicon nitride (SiNx), silicon oxide (SiOx), silicon oxynitride (SiOxNy), or a metal oxide such as aluminum oxide (AlOx).

The transistor TR may be a thin film transistor. According to an embodiment, the transistor TR may be a driving transistor.

The transistor TR may be electrically connected to a light emitting element LD. The transistor TR may be electrically connected to the bridge pattern BRP.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, low temperature polycrystalline silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may be semiconductor patterns doped with impurities. A region between the first contact region and the second contact region may be a channel region. The channel region may be an intrinsic semiconductor pattern that may not be doped with impurities.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include an inorganic material. According to an example, the gate insulating layer GI may include at least one of silicon nitride (SiNx), silicon oxide (SiOx), silicon oxynitride (SiOxNy), and aluminum oxide (AlOx).

The first interlayer insulating layer ILD1 may be disposed on the gate electrode GE. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The first transistor electrode TE1 and the second transistor electrode TE2 may be disposed on the first interlayer insulating layer ILD1. The first transistor electrode TE1 may pass through the gate insulating layer GI and the first interlayer insulating layer ILD1 to make contact with the first contact region of the active layer ACT. The second transistor electrode TE2 may pass through the gate insulating layer GI and the first interlayer insulating layer ILD1 to make contact with the second contact region of the active layer ACT. According to an example, the first transistor electrode TE1 may be a drain electrode, and the second transistor electrode TE2 may be a source electrode, but the disclosure is not limited thereto.

The second interlayer insulating layer ILD2 may be disposed on the first transistor electrode TE1 and the second transistor electrode TE2. Like the first interlayer insulating layer ILD1 and the gate insulating layer GI, the second interlayer insulating layer ILD2 may include an inorganic material. The inorganic material may include at least one of materials disclosed as materials constituting the first interlayer insulating layer ILD1 and the gate insulating layer GI, for example, silicon nitride (SiNx), silicon oxide (SiOx), silicon oxynitride (SiOxNy), aluminum oxide (AlOx), or a combination thereof.

The bridge pattern BRP may be disposed on the second interlayer insulating layer ILD2. The bridge pattern BRP may be connected to the first transistor electrode TE1 through a contact hole penetrating the second interlayer insulating layer ILD2. The bridge pattern BRP may be electrically connected to a first electrode ELT1 through the contact portion CNT formed in the passivation layer PSV.

The power source line PL may be disposed on the second interlayer insulating layer ILD2. The power source line PL may be electrically connected to a second electrode ELT2 through another contact portion (not shown) formed in the passivation layer PSV.

The passivation layer PSV may be disposed on the second interlayer insulating layer ILD2. The passivation layer PSV may cover the bridge pattern BRP and the power source line PL. The passivation layer PSV may be provided in a form including an organic insulating layer, an inorganic insulating layer, or an organic insulating layer disposed on the inorganic insulating layer, but the disclosure is not limited thereto. According to an embodiment, the contact portion CNT connected to a region of the bridge pattern BRP and another contact portion connected to a region of the power source line PL may be formed in the passivation layer PSV.

The display element unit DPL may be disposed on the pixel circuit unit PCL. The display element unit DPL may include an insulating pattern INP, the first electrode ELT1, the second electrode ELT2, a first insulating layer INS1, a bank BNK, the light emitting element LD, a second insulating layer INS2, a first contact electrode CNE1, a third insulating layer INS3, and a second contact electrode CNE2.

The insulating pattern INP may protrude in a thickness direction (for example, a third direction DR3) of the base layer BSL. The insulating pattern INP may provide a surface on which the first electrode ELT1 and the second electrode ELT2 may be arranged.

The first electrode ELT1 and the second electrode ELT2 may be disposed on the pixel circuit unit PCL and the insulating pattern INP. As described above, the first electrode ELT1 and the second electrode ELT2 may be alignment electrodes for aligning the light emitting element LD. For example, in an operation of aligning light emitting elements LD, the first electrode ELT1 and the second electrode ELT2 may receive a first alignment signal and a second alignment signal, respectively. The first alignment signal and the second alignment signal may have different waveforms, potentials, and/or phases. Accordingly, an electric field may be formed between the first electrode ELT1 and the second electrode ELT2, and the light emitting elements LD may be aligned between the first electrode ELT1 and the second electrode ELT2 based on the electric field.

A portion of each of the first electrode ELT1 and the second electrode ELT2 may be disposed on the insulating pattern INP to form a reflective wall. Accordingly, light output efficiency of the display device 1000 may be improved.

According to an embodiment, the first electrode ELT1 may be electrically connected to the light emitting element LD through the first contact electrode CNE1. The second electrode ELT2 may be electrically connected to the light emitting element LD through the second contact electrode CNE2.

The first insulating layer INS1 may be disposed on the pixel circuit unit PCL, the first electrode ELT1, and the second electrode ELT2. The first insulating layer INS1 may stabilize the connection between electrode components and reduce external influences. The first insulating layer INS1 may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The bank BNK may protrude in the thickness direction of the base layer BSL (for example, the third direction DR3). The bank BNK may include an organic material such as an acrylates resin, an epoxy resin, a phenolic resin, a polyamides resin, a polyimides resin, a polyesters resin, a polyphenylenesulfides resin, benzocyclobutene (BCB), or a combination thereof. However, the disclosure is not necessarily limited thereto, and the bank BNK may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

The light emitting element LD may be disposed on the first insulating layer INS1. According to an embodiment, the light emitting element LD may emit light based on electrical signals provided from the first contact electrode CNE1 and the second contact electrode CNE2.

The light emitting element LD may include a first semiconductor layer SCL1, a second semiconductor layer SCL2, and an active layer ACL interposed between the first and second semiconductor layers SCL1 and SCL2. For example, in case that a direction in which the light emitting element LD extends is referred to as a length L direction, the light emitting element LD may include the first semiconductor layer SCL1, the active layer ACL, and the second semiconductor layer SCL2 sequentially stacked on each other along the length L direction.

The light emitting element LD may be provided in a columnar shape extending in a direction. The light emitting element LD may have a first end EP1 and a second end EP2. The first semiconductor layer SCL1 may be adjacent to the first end EP1 of the light emitting element LD, and the second semiconductor layer SCL2 may be adjacent to the second end EP2 of the light emitting element LD.

The light emitting element LD may be a light emitting element manufactured in a columnar shape through an etching method or the like. In the disclosure, columnar shape may generally refer to a rod-like shape or a bar-like shape elongated in the length L direction (for example, has an aspect ratio greater than 1), such as a circular column or a polygonal column, and the shape of the cross-section thereof is not particularly limited. For example, a length L of the light emitting element LD may be greater than a diameter D (or a width of a cross-section) thereof.

The light emitting element LD may have a size of a nano-meter scale to a micro-meter scale. For example, the light emitting element LD may have a diameter D (or width) and/or a length L ranging from a nano-meter scale to a micro-meter scale. However, the size of the light emitting element LD is not limited thereto.

The first semiconductor layer SCL1 may be a semiconductor layer of a first conductivity type. The first semiconductor layer SCL1 may be disposed on the active layer ACL and may include a semiconductor layer of a different type from that of the second semiconductor layer SCL2. For example, the first semiconductor layer SCL1 may include a P-type semiconductor layer. For example, the first semiconductor layer SCL1 may include a P-type semiconductor layer including at least one semiconductor material of InAlGaN, GaN, AlGaN, InGaN, AlN, and InN, and doped with a first conductivity type dopant such as Mg. However, the material constituting the first semiconductor layer SCL1 is not limited thereto, and various other materials may be used to form the first semiconductor layer SCL1.

The active layer ACL may be disposed on the second semiconductor layer SCL2 and may have a single-quantum well or multi-quantum well structure. The position of the active layer ACL may be variously changed according to the type of the light emitting element LD.

A clad layer doped with a conductive dopant may be formed on the upper and/or lower portions of the active layer ACL. For example, the clad layer may be an AlGaN layer or an InAlGaN layer. According to an embodiment, a material such as AlGaN or InAlGaN may be used to form the active layer ACL, and various other materials may be used to form the active layer ACL.

The second semiconductor layer SCL2 may be a semiconductor layer of a second conductivity type. The second semiconductor layer SCL2 may be disposed on the active layer ACL and may include a semiconductor layer of a different type from that of the first semiconductor layer SCL1. For example, the second semiconductor layer SCL2 may include an N-type semiconductor layer. For example, the second semiconductor layer SCL2 may include an N-type semiconductor layer including at least one semiconductor material of InAlGaN, GaN, AlGaN, InGaN, AlN, and InN, and doped with a second conductivity type dopant such as Si, Ge, Sn, and/or the like. However, the material constituting the second semiconductor layer SCL2 is not limited thereto, and various other materials may be used to form the second semiconductor layer SCL2.

In case that a voltage equal to or greater than a threshold voltage is applied to both ends of the light emitting element LD, the light emitting element LD may emit light while electron-hole pairs may be combined in the active layer ACL. By controlling the light emitting of the light emitting element LD using this principle, the light emitting element LD can be used as a light source of various light emitting devices including pixels of a display device.

The light emitting element LD may further include an insulating layer INF provided on a surface thereof. The insulating layer INF may be formed on the surface of the light emitting element LD to surround at least an outer peripheral surface of the active layer ACL. The insulating layer INF may further surround one region of the first and second semiconductor layers SCL1 and SCL2. The insulating layer INF may be formed of a single layer or a double layer, but the disclosure is not limited thereto, and may be formed of layers.

The insulating layer INF may expose ends of the light emitting element LD having different polarities. For example, the insulating layer INF may expose one end of each of the first and second semiconductor layers SCL1 and SCL2 positioned at the first and second ends EP1 and EP2 of the light emitting element LD. In another embodiment, the insulating layer INF may expose side portions of the first and second semiconductor layers SCL1 and SCL2 adjacent to the first and second ends EP1 and EP2 of the light emitting element LD having different polarities.

The insulating layer INF may be formed of a single layer or multiple layers including at least one of silicon oxide (SiOx), silicon nitride (SiNx), silicon oxynitride (SiOxNy), aluminum oxide (AlOx), and titanium oxide (TiOx), but the disclosure is not limited thereto. For example, according to another embodiment, the insulating layer INF may be omitted.

According to an embodiment, in case that the insulating layer INF is provided to cover the surface of the light emitting element LD, particularly, the outer peripheral surface of the active layer ACL, electrical stability of the light emitting element LD can be secured. In case that the insulating layer INF is provided on the surface of the light emitting element LD, surface defects of the light emitting element LD may be minimized, so that lifespan and efficiency can be improved. Even in case that light emitting elements LD are disposed adjacent to each other, an unwanted short circuit between the light emitting elements LD can be prevented.

According to an embodiment, the light emitting element LD may further include additional components in addition to the first semiconductor layer SCL1, the active layer ACL, the second semiconductor layer SCL2, and/or the insulating layer INF surrounding them. For example, the light emitting element LD may further include a phosphor layer, an active layer, a semiconductor layer, and/or an electrode layer. A contact electrode layer may be further disposed at the first and second ends EP1 and EP2 of the light emitting element LD, respectively.

The light emitting element LD may be disposed in an area surrounded by the bank BNK. Accordingly, an emission area EMA may be defined as an area in which the light emitting element LD may be disposed. The light emitting element LD may be disposed between adjacent insulating patterns INP.

The second insulating layer INS2 may be disposed on the light emitting element LD. The second insulating layer INS2 may cover the active layer AL of the light emitting element LD.

The second insulating layer INS2 may expose at least a portion of the light emitting element LD. For example, the second insulating layer INS2 may not cover the first end EP1 and the second end EP2 of the light emitting element LD. Accordingly, the first end EP1 and the second end EP2 of the light emitting element LD may be exposed, and may be electrically connected to the first contact electrode CNE1 and the second contact electrode CNE2, respectively.

In case that the second insulating layer INS2 is formed on the light emitting elements LD after the alignment of the light emitting elements LD may be completed, it may be possible to prevent the light emitting elements LD from being separated from the aligned positions.

The second insulating layer INS2 may be formed of a single layer or multiple layers. The second insulating layer INS2 may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof. However, the disclosure is not limited to the above-described examples.

The first contact electrode CNE1 and the second contact electrode CNE2 may be disposed on the first insulating layer INS1. The first contact electrode CNE1 may be electrically connected to the first end EP1 of the light emitting element LD. The second contact electrode CNE2 may be electrically connected to the second end EP2 of the light emitting element LD.

The first contact electrode CNE1 may be electrically connected to the first electrode ELT1 through a contact hole penetrating the first insulating layer INS1. The second contact electrode CNE2 may be electrically connected to the second electrode ELT2 through a contact hole penetrating the first insulating layer INS1.

The first contact electrode CNE1 and the second contact electrode CNE2 may include a conductive material. For example, the first contact electrode CNE1 and the second contact electrode CNE2 may include a transparent conductive material including at least one of indium tin oxide (ITO), indium zinc oxide (IZO), and indium tin zinc oxide (ITZO). However, the disclosure is not necessarily limited to the above-described examples.

The third insulating layer INS3 may be disposed on the first insulating layer INS1, the first contact electrode CNE1, the second contact electrode CNE2, and the second insulating layer INS2. The third insulating layer INS3 may be formed of a single layer or multiple layers. The third insulating layer INS3 may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), titanium oxide (TiOx), or a combination thereof.

A structure of a pixel PXL according to an embodiment is not necessarily limited to the above-described examples. For example, the pixel may further include an additional bank disposed on the bank BNK. The pixel may further include a color conversion layer including quantum dots configured to change a wavelength of light emitted from the light emitting element LD. For example, the color conversion layer may be disposed on the same layer as the display element unit DPL or may be disposed on the display element unit DPL. Also, the pixel may further include a color filter layer that selectively transmits light of a wavelength band.

The panel cover unit 140 may be disposed on the rear surface of the display unit 120. The panel cover unit 140 may be disposed on a surface of the display unit 120. The panel cover unit 140 may be disposed on a surface of the base layer BSL. For example, the pixel circuit unit PCL may be disposed on a surface of the base layer BSL, and the panel cover unit 140 may be disposed on another surface of the base layer BSL.

According to an embodiment, the panel cover unit 140 may include a cushion layer CUS and a heat dissipation layer HSL.

The cushion layer CUS may be disposed on a rear surface of the base layer BSL. The cushion layer CUS may be disposed between the display unit 120 and the heat dissipation layer HSL. A surface of the cushion layer CUS may be in contact with the heat dissipation layer HSL.

The cushion layer CUS may include a deformable elastic material and may alleviate an external shock applied to the display panel 100. For example, the cushion layer CUS may include thermoplastic elastomer, polystyrene, polyolefin, polyurethane thermoplastic elastomers, polyamides, synthetic rubbers, polydimethylsiloxane, polybutadiene, polyisobutylene, poly(styrene-butadiene styrene), polyurethanes, polychloroprene, polyethylene, silicone, or combinations thereof. The material constituting the cushion layer CUS is not limited to the above-described examples, and a suitable material may be selected from materials having elasticity.

The heat dissipation layer HSL may perform a heat dissipation function for the display panel 100. The heat dissipation layer HSL may be configured to efficiently dissipate heat generated by the display panel 100.

The heat dissipation layer HSL may be disposed on the rear surface of the display unit 120. The heat dissipation layer HSL may be disposed on the cushion layer CUS. According to an embodiment, in case that the cushion layer CUS is not disposed, the heat dissipation layer HSL may be disposed on the rear surface of the base layer BSL.

The heat dissipation layer HSL may include a material having high thermal conductivity. For example, the heat dissipation layer HSL may include graphite. According to an embodiment, in case that the heat dissipation layer HSL includes graphite, light absorption may be high.

The heat dissipation layer HSL may be disposed outside the display panel 100 to dissipate heat. In particular, according to an embodiment, since the heat dissipation layer HSL has a heat dissipation pattern, heat dissipation performance can be sufficiently secured, and cracks can be prevented from occurring. This will be described later with reference to FIGS. 4 to 11.

FIGS. 4 to 11 are diagrams schematically illustrating heat dissipation layers HSL according to embodiments.

Figure 4:
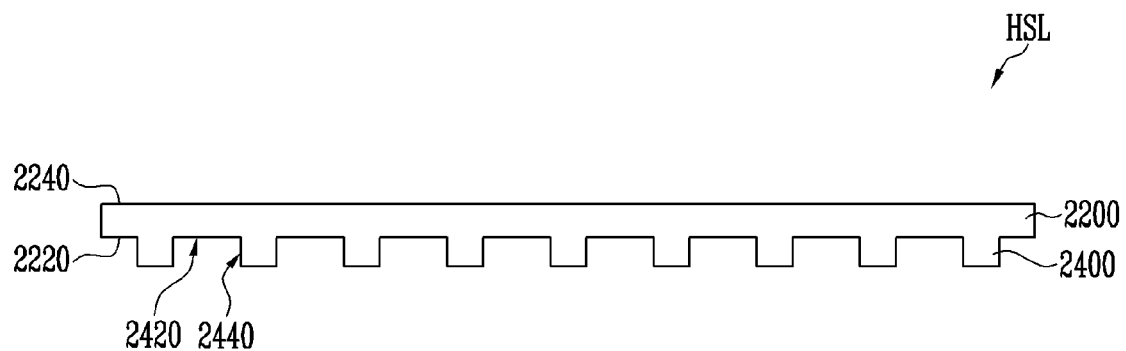
FIG. 4 is a cross-sectional view schematically illustrating a heat dissipation layer according to an embodiment.

FIG. 4 is a cross-sectional view schematically illustrating a heat dissipation layer according to an embodiment. Referring to FIG. 4, a heat dissipation layer HSL may include a base heat dissipation layer 2200 and a heat dissipation pattern 2400.

The base heat dissipation layer 2200 may be disposed between the base layer BSL and the heat dissipation pattern 2400. The base heat dissipation layer 2200 may provide an area in which the heat dissipation pattern 2400 is to be formed. For example, a first surface 2220 of the base heat dissipation layer 2200 may be in contact with the heat dissipation pattern 2400. The base heat dissipation layer 2200 may have an overall flat shape. Heat dissipation patterns 2400 may be provided as a pattern on the first surface 2220 of the base heat dissipation layer 2200.

A second surface 2240 of the base heat dissipation layer 2200 on which the heat dissipation pattern 2400 may not be arranged may not contact the heat dissipation pattern 2400. The second surface 2240 of the base heat dissipation layer 2200 may be closer to the base layer BSL than the first surface 2220.

According to an embodiment, at least a portion of the heat dissipation pattern 2400 and at least a portion of the base heat dissipation layer 2200 on which the heat dissipation pattern 2400 may not be arranged may be exposed.

The heat dissipation pattern 2400 may be disposed on the first surface 2220 of the base heat dissipation layer 2200. The heat dissipation pattern 2400 may be patterned to be integrally formed with the base heat dissipation layer 2200 (integral with each other). Multiple heat dissipation patterns 2400 may be provided. The heat dissipation pattern 2400 may protrude in a direction different from a main surface of the base heat dissipation layer 2200. For example, the heat dissipation pattern 2400 may have a shape protruding in a thickness direction of the base heat dissipation layer 2200. According to a structure of an embodiment, an effect of expanding an area exposed to outside of the heat dissipation layer HSL can be obtained, and accordingly, the heat dissipation performance of the heat dissipation layer HSL can be improved. For example, the heat dissipation pattern 2400 may form groove areas 2420, and the heat dissipation pattern 2400 may be provided with side areas 2440 due to the groove areas 2420. According to an embodiment, heat may be emitted through the side areas 2440, and as described above, an effect of improving heat dissipation performance can be obtained.

The heat dissipation pattern 2400 may be further spaced apart from the base layer BSL compared to the base heat dissipation layer 2200. For example, according to an embodiment, the heat dissipation layer HSL may be provided such that the patterned area faces outward.

According to an embodiment, by performing a molding process on a graphite member, the heat dissipation layer HSL including the base heat dissipation layer 2200 and the heat dissipation pattern 2400 may be provided. Accordingly, the base heat dissipation layer 2200 and the heat dissipation pattern 2400 may be integrally formed. For example, the graphite member may be provided for a mold including a molding pattern formed to be complementary to the heat dissipation pattern 2400 to be manufactured. Thereafter, a pattern may be formed on the graphite member, and the heat dissipation layer HSL including the base heat dissipation layer 2200 and the heat dissipation pattern 2400 may be manufactured.

According to an embodiment, the base heat dissipation layer 2200 and the heat dissipation pattern 2400 may include the same material. For example, the base heat dissipation layer 2200 and the heat dissipation pattern 2400 may include graphite. For example, the base heat dissipation layer 2200 and the heat dissipation pattern 2400 may be formed in the same process (for example, the molding process) and provided at the same time.

Hereinafter, structures of heat dissipation layers HSL according to embodiments will be described with reference to FIGS. 5 to 11. In FIGS. 5 to 11 below, the base heat dissipation layer 2200 and the heat dissipation pattern 2400 are shown with lines so that they can be readily distinguished. However, as described above, according to an embodiment, the base heat dissipation layer 2200 and the heat dissipation pattern 2400 may be integrally formed.

Figure 6:
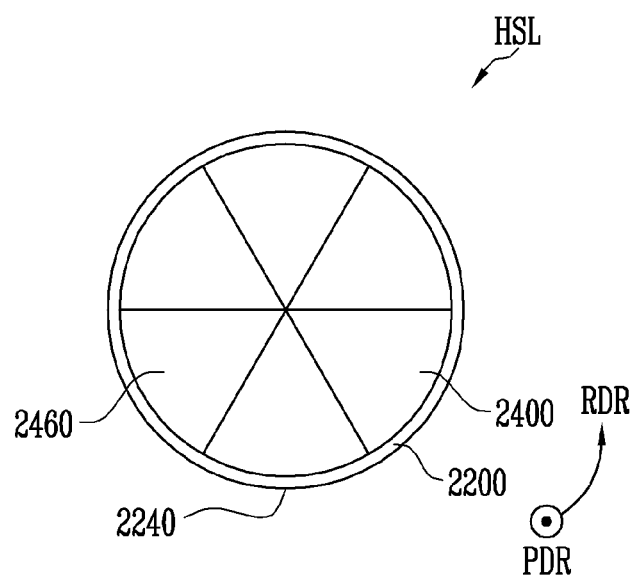

FIGS. 5 and 6 are diagrams schematically illustrating a heat dissipation layer according to an embodiment.

Referring to FIGS. 5 and 6, a heat dissipation layer HSL according to an embodiment may include a heat dissipation pattern 2400 having a triangular column shape.

The heat dissipation pattern 2400 may have a triangular column shape extending in a pattern direction PDR. Heat dissipation patterns 2400 may be provided and may be arranged along the rolling direction RDR. A bottom surface 2460 of each pattern of the heat dissipation pattern 2400 may have a triangular shape.

According to an embodiment, the heat dissipation layer HSL may be rolled along the rolling direction RDR. For example, in case that the display panel 100 is rolled along the rolling direction RDR, at least a portion of adjacent heat dissipation patterns 2400 may be in contact with each other (refer to FIG. 6).

In an embodiment, since the second surface 2240 of the base heat dissipation layer 2200 may be adjacent to the base layer BSL, the display panel 100 may be rolled so that a display surface of the display panel 100 faces outward. However, the disclosure is not necessarily limited thereto.

According to an embodiment, since the bottom surface 2460 of the heat dissipation pattern 2400 has the triangular shape, in case that the display panel 100 is rolled, generation of stress in the heat dissipation layer HSL may be minimized. For example, the triangular shape of the bottom surface 2460 may be an isosceles triangular shape in which two sides have substantially the same length. Inner angles adjacent to the two sides of the isosceles triangular shape may be appropriately selected according to the degree to which the display panel 100 may be rolled. For example, a length of a side of the bottom surface 2460 of the heat dissipation pattern 2400 may be less than or equal to the radius of a circle defined by the heat dissipation layer HSL in case of rolling.

Hereinafter, other embodiments will be described. Contents that may be duplicative of that described above will be briefly described or omitted.

Figure 7:
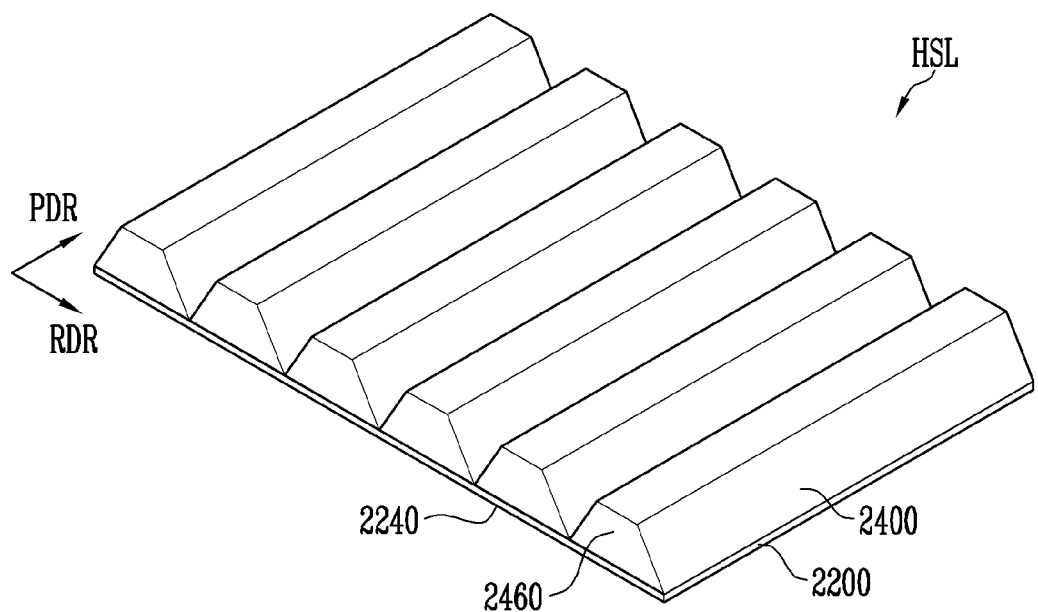
FIGS. 7 and 8 are diagrams schematically illustrating a heat dissipation layer according to another embodiment.
Figure 8:
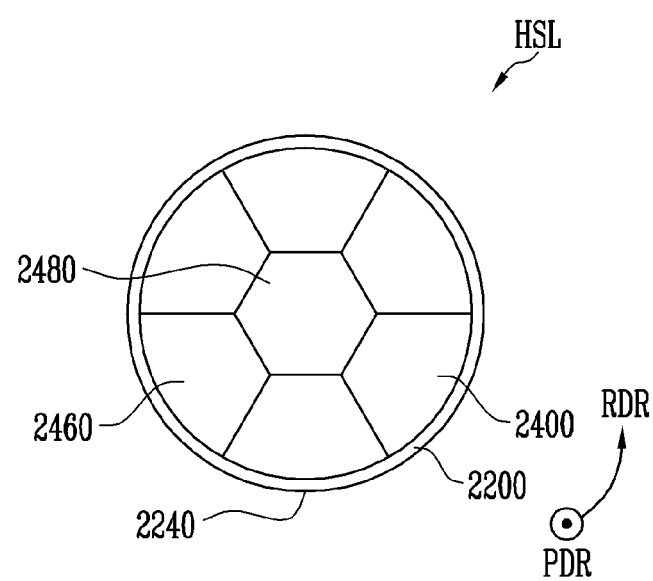

FIGS. 7 and 8 are diagrams schematically illustrating a heat dissipation layer according to another embodiment.

Referring to FIGS. 7 and 8, a heat dissipation layer HSL according to an embodiment may include a heat dissipation pattern 2400 having a rectangular column shape.

The heat dissipation pattern 2400 may have a rectangular column shape extending in a pattern direction PDR. A bottom surface 2460 of each pattern of the heat dissipation pattern 2400 may have a rectangular shape. For example, the bottom surface 2460 of the heat dissipation pattern 2400 may have a trapezoidal shape. Longer sides of parallel sides of the trapezoidal shape may be disposed adjacent to the base heat dissipation layer 2200.

According to an embodiment, in case that the heat dissipation layer HSL is rolled along a rolling direction RDR, at least a portion of adjacent heat dissipation patterns 2400 may be in contact with each other. For example, in an embodiment, the bottom surface 2460 of the heat dissipation pattern 2400 may include two parallel sides and two inclined sides. In case that the heat dissipation layer HSL is rolled, at least a portion of the two inclined sides adjacent to each other may be in contact with each other.

According to an embodiment, as described above, while generation of stress may be suppressed, at least a portion of the heat dissipation pattern 2400 may have a flat shape. Therefore, structural stability can be improved.

According to an embodiment, in case that the base heat dissipation layer 2200 is rolled, an inner cavity 2480 may be formed. The inner cavity 2480 may be an area in which the heat dissipation patterns 2400 of the base heat dissipation layer 2200 cannot contact each other, and the inner cavity 2480 can readily dissipate heat to outside even after the base heat dissipation layer 2200 may be rolled.

Figure 9:
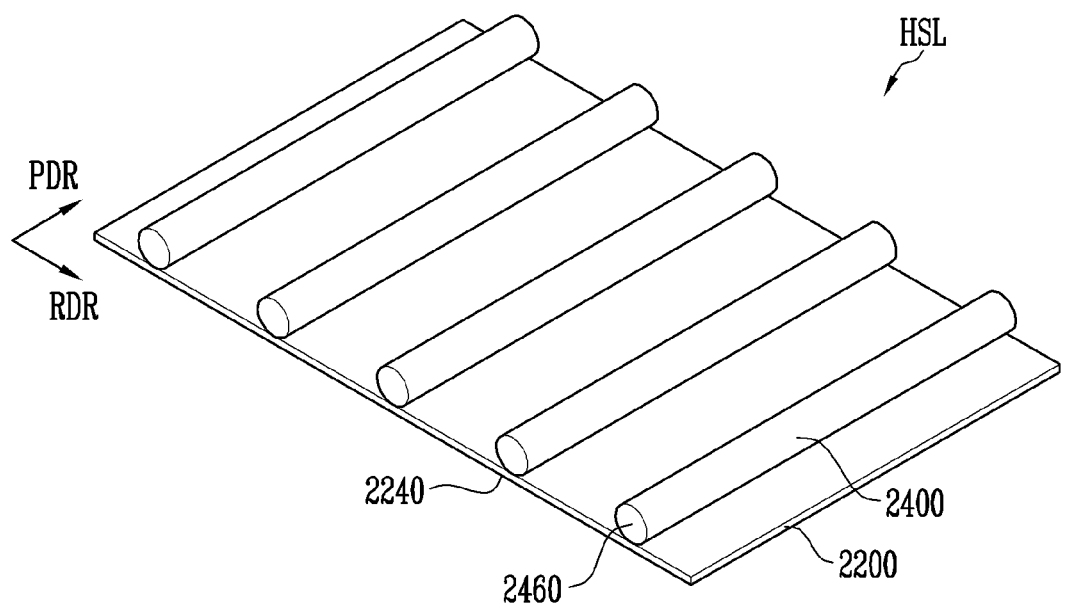
FIGS. 9 and 10 are diagrams schematically illustrating a heat dissipation layer according to yet another embodiment.
Figure 10:
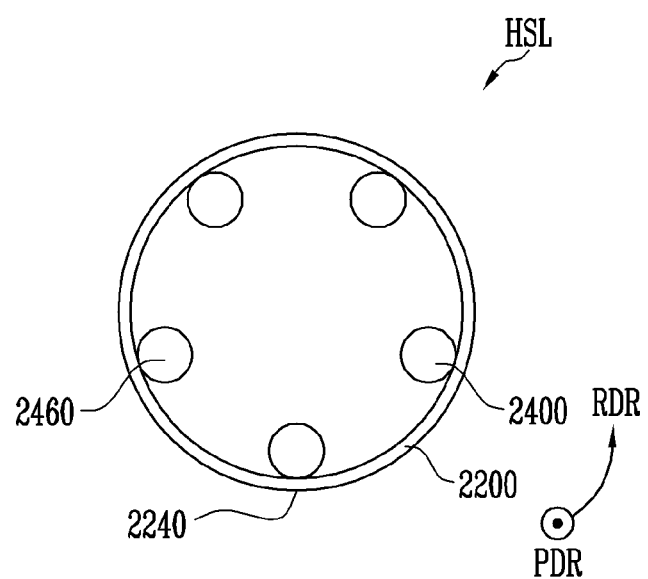

FIGS. 9 and 10 are diagrams schematically illustrating a heat dissipation layer according to yet another embodiment.

Referring to FIGS. 9 and 10, a heat dissipation layer HSL according to an embodiment may include a heat dissipation pattern 2400 having a cylindrical shape.

The heat dissipation pattern 2400 may have a cylindrical shape extending in a pattern direction PDR. A bottom surface 2460 of each pattern of the heat dissipation pattern 2400 may have a circular shape. According to an embodiment, the bottom surface 2460 of each pattern of the heat dissipation pattern 2400 may have an elliptical shape.

According to an embodiment, even in case that the heat dissipation layer HSL is rolled along a rolling direction RDR, heat dissipation patterns 2400 may not contact each other. However, the disclosure is not necessarily limited thereto. According to an embodiment, the heat dissipation patterns 2400 may be configured to contact each other by adjusting the size and spacing of the heat dissipation patterns 2400.

Figure 11:
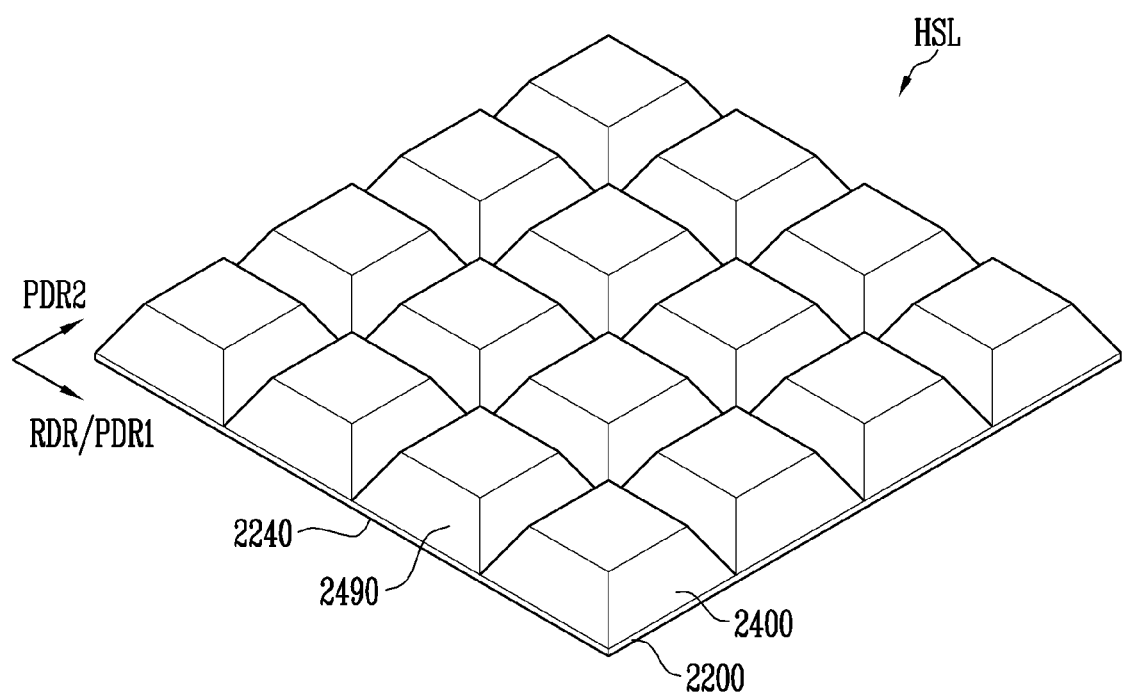
FIG. 11 is a diagram schematically illustrating a heat dissipation layer according to still another embodiment.

FIG. 11 is a diagram schematically illustrating a heat dissipation layer according to still another embodiment.

Referring to FIG. 11, a heat dissipation layer HSL according to an embodiment may include a heat dissipation pattern 2400 forming a lattice structure. According to an embodiment, the heat dissipation pattern 2400 may include pattern portions 2490.

The pattern portions 2490 may form the lattice structure defined based on a first pattern direction PDR1 extending in the same direction as a rolling direction RDR and a second pattern direction PDR2 extending in a direction different from the rolling direction RDR. For example, the pattern portions 2490 may be arranged along the second pattern direction PDR2 while being arranged along the first pattern direction PDR1. According to an embodiment, the first pattern direction PDR1 and the second pattern direction PDR2 may be orthogonal to each other, but the disclosure is not limited thereto.

According to an embodiment, the pattern portions 2490 may have a rectangular column shape. For example, the pattern portions 2490 may have a shape protruding in the display direction of the display panel 100. However, the disclosure is not necessarily limited thereto.

In an embodiment, as in an earlier embodiment, in case that the heat dissipation layer HSL is rolled, an inner cavity may be formed.

The heat dissipation layer HSL according to an embodiment may be strong against stress generated not only in the rolling direction RDR but also in the pattern direction PDR. For example, in case that the display panel 100 is substantially rolled, stress may also be generated not only in the rolling direction RDR but also in a direction different from the rolling direction RDR. However, in the heat dissipation layer HSL according to an embodiment, since the pattern portions 2490 may be arranged even in the second pattern direction PDR2 different from the rolling direction RDR, the display device 1000 can be better protected against external stress.

According to an embodiment of the disclosure, a heat dissipation layer may improve heat dissipation efficiency and prevent damage to a heat dissipation structure, and a flexible display device may include the heat dissipation layer.

Effects of the disclosure are not limited to the above-described effects, and effects that are not mentioned may be clearly understood by those skilled in the art to which the disclosure pertains from the specification and the accompanying drawings.

As described above, the embodiments of the disclosure have been disclosed through the detailed description and the drawings. However, those skilled in the art or those of ordinary skill in the art will appreciate that various modifications and changes are possible without departing from the spirit and technical scope of the disclosure.

Therefore, the technical scope of the disclosure is not limited to the detailed description described in the specification.

What is claimed is:

1. A flexible display device comprising:
    a display part including a light emitting element disposed on a base layer; and
    a panel cover disposed on a rear surface of the display part and including a heat dissipation layer,
    wherein the heat dissipation layer includes:
        a base heat dissipation layer; and
        a heat dissipation pattern patterned on the base heat dissipation layer; and
    a display panel including the display part and the panel cover, the display panel being rollable in a rolling direction, wherein
    the heat dissipation layer is rolled in case that the display panel is rolled, wherein the heat dissipation layer comprises at least one of:
        a pattern extending in a pattern direction that is different from the rolling direction, and has a triangular column shape, a rectangular column shape, or a cylindrical shape; or
        the heat dissipation pattern includes pattern portions arranged in a lattice structure defined by a first pattern direction and a second pattern direction,
        the first pattern direction and the rolling direction are same, and
        the second pattern direction and the rolling direction are different.

2. The flexible display device of claim 1, wherein the heat dissipation layer includes graphite.

3. The flexible display device of claim 1, wherein the base heat dissipation layer is disposed between the base layer of the display part and the heat dissipation pattern of the heat dissipation layer.

4. The flexible display device of claim 3, wherein
    the base heat dissipation layer includes:
        a first surface, and
        a second surface,
    the first surface is adjacent to the base layer, and
    the second surface of the base heat dissipation layer is in physical contact with the heat dissipation pattern.

5. The flexible display device of claim 4, wherein the base heat dissipation layer and the heat dissipation pattern are integral with each other.

6. A flexible display device comprising:
    a display part including a light emitting element disposed on a base layer; and
    a panel cover disposed on a rear surface of the display part and including a heat dissipation layer,
    wherein the heat dissipation layer includes: a base heat dissipation layer; and a heat dissipation pattern patterned on the base heat dissipation layer,
    the base heat dissipation layer is disposed between the base layer of the display part and the heat dissipation pattern of the heat dissipation layer,
    the base heat dissipation layer includes: a first surface, and a second surface,
    the first surface is adjacent to the base layer,
    the second surface of the base heat dissipation layer is in physical contact with the heat dissipation pattern,
    the base heat dissipation layer and the heat dissipation pattern are integral with each other, and the base heat dissipation layer and the heat dissipation pattern are provided by performing a molding process on a graphite member.

7. The flexible display device of claim 1, wherein the heat dissipation pattern protrudes in a thickness direction of the base heat dissipation layer.

8. The flexible display device of claim 1, wherein at least a portion of the base heat dissipation layer on which the heat dissipation pattern is not disposed and at least a portion of the heat dissipation pattern are exposed.

9. The flexible display device of claim 1, wherein
    the heat dissipation layer includes a groove area disposed between adjacent heat dissipation patterns, and a side surface of the heat dissipation pattern is exposed in the groove area.

10. The flexible display device of claim 1, wherein at least a portion of adjacent heat dissipation patterns are in physical contact with each other in case that the heat dissipation layer is rolled.

11. The flexible display device of claim 1, wherein an inner cavity is formed in which adjacent heat dissipation patterns do not contact each other in case that the heat dissipation layer is rolled.

12. The flexible display device of claim 1, wherein the pattern portions have a rectangular column shape protruding in a display direction of the display panel.

13. The flexible display device of claim 1, wherein the display panel is at least one of a flexible organic light emitting display panel (OLED panel), a flexible light emitting diode display panel (flexible micro-LED or nano LED display panel), and a flexible quantum dot organic light emitting display panel (QD OLED panel).

14. The flexible display device of claim 1, wherein a length of a side of the heat dissipation pattern is less than or equal to a radius of a circle defined by the heat dissipation layer in case that the display panel is rolled.

15. A heat dissipation layer comprising:
a base heat dissipation layer; and
heat dissipation patterns patterned on the base heat dissipation layer,
wherein the heat dissipation patterns protrude in a thickness direction of the heat dissipation layer, wherein
the heat dissipation layer is rolled in case, wherein the heat dissipation layer comprises at least one of:
a pattern extending in a pattern direction that is different from a rolling direction, and has a triangular column shape, a rectangular column shape, or a cylindrical shape; or
the heat dissipation pattern includes pattern portions arranged in a lattice structure defined by a first pattern direction and a second pattern direction,
the first pattern direction and the rolling direction are same, and
the second pattern direction and the rolling direction are different.

* * * * *